(12) United States Patent
Zhu et al.

(10) Patent No.: US 9,406,549 B2
(45) Date of Patent: Aug. 2, 2016

(54) PLANARIZATION PROCESS

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Jun Luo, Beijing (CN); Chunlong Li, Beijing (CN); Jian Deng, Beijing (CN); Chao Zhao, Kessel-lo (BE)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/647,393

(22) PCT Filed: Dec. 20, 2012

(86) PCT No.: PCT/CN2012/087020
§ 371 (c)(1),
(2) Date: May 26, 2015

(87) PCT Pub. No.: WO2014/082357
PCT Pub. Date: Jun. 5, 2014

(65) Prior Publication Data
US 2015/0325452 A1 Nov. 12, 2015

(30) Foreign Application Priority Data

Nov. 30, 2012 (CN) .......................... 2012 1 0505860

(51) Int. Cl.
*H01L 21/321* (2006.01)
*H01L 21/265* (2006.01)
*H01L 21/3105* (2006.01)
*H01L 21/762* (2006.01)
*H01L 29/10* (2006.01)
*H01L 29/66* (2006.01)
*H01L 21/308* (2006.01)
*H01L 21/311* (2006.01)
*H01L 21/8234* (2006.01)
*H01L 21/3213* (2006.01)

(52) U.S. Cl.
CPC .... *H01L 21/76229* (2013.01); *H01L 21/26513* (2013.01); *H01L 21/308* (2013.01); *H01L 21/31053* (2013.01); *H01L 21/31056* (2013.01); *H01L 21/31105* (2013.01); *H01L 21/32115* (2013.01); *H01L 21/32132* (2013.01); *H01L 21/823481* (2013.01); *H01L 29/1083* (2013.01); *H01L 29/6681* (2013.01)

(58) Field of Classification Search
None
See application file for complete search history.

(56) References Cited

U.S. PATENT DOCUMENTS

| 5,416,048 A * | 5/1995 | Blalock ............. H01L 21/76838 204/192.32 |
|---|---|---|
| 7,955,964 B2 | 6/2011 | Wu et al. |
| 2005/0170661 A1 | 8/2005 | Economikos et al. |
| 2008/0191249 A1 | 8/2008 | Hsieh et al. |

FOREIGN PATENT DOCUMENTS

| CN | 1841666 A | 10/2006 |
|---|---|---|
| CN | 101582390 A | 11/2009 |
| JP | 8-56024 A | 2/1996 |
| TW | 288161 B | 10/1996 |
| WO | WO 01/56070 A | 8/2001 |

OTHER PUBLICATIONS

Chinese Office Action of CN 201210505860.1 dated Dec. 28, 2015 with its English Translation.

* cited by examiner

*Primary Examiner* — Asok K Sarkar
(74) *Attorney, Agent, or Firm* — Christensen Fonder P.A.

(57) ABSTRACT

A planarization process, the process including performing first sputtering on a material layer, with an area of the material layer which has a relatively low loading condition for sputtering shielded by a first shielding layer, removing the first shielding layer, and performing second sputtering on the material layer to planarize the material layer.

12 Claims, 12 Drawing Sheets

PLANARIZATION PROCESS

CROSS-REFERENCE TO RELATED APPLICATION(S)

This application is a U.S. national phase application of PCT Application No. PCT/CN2012/087020, filed on Dec. 20, 2012, entitled "PLANARIZATION PROCESS," which claimed priority to Chinese Application No. 201210505860.1, filed on Nov. 30, 2012. Both the PCT Application and the Chinese Application are incorporated herein by reference in their entireties.

TECHNICAL FIELD

The present disclosure relates to the semiconductor field, and more specifically, to a planarization process.

BACKGROUND

A planarization process such as Chemical Mechanical Polishing (CMP) is generally used in semiconductor processes to obtain a relatively planar surface. However, in a case where a material layer is planarized by CMP, it is difficult to control a surface flatness of the material layer after CMP to be in a range of, e.g., several nanometers, if a relatively thick portion thereof is needed to be ground.

On the other hand, if the planarization process is to be performed on a material layer covering features, especially non-uniform features, there is a possibility that the material layer has non-uniformly distributed fluctuations formed thereon due to presence of the features. Thus, the planarization may not be performed consistently.

SUMMARY

The present disclosure aims to provide, among others, a planarization process.

According to an aspect of the present disclosure, there is provided a method of planarizing a material layer formed on a substrate, comprising: performing first sputtering on the material layer, with an area of the material layer which has a relatively low loading condition for sputtering shielded by a first shielding layer; removing the first shielding layer; and performing second sputtering on the material layer to planarize the material layer.

According to a further aspect of the present disclosure, there is provided a method of planarizing a material layer formed on a substrate, comprising: performing first sputtering on the material layer, with an area of the material layer which has a relatively high loading condition for sputtering shielded by a first shielding layer, to planarize a portion of the material layer which is not shielded by the first shielding layer; removing the first shielding layer; forming a second shielding layer on the portion of the material layer, wherein the second shielding layer does not overlap with the first shielding layer; and performing second sputtering on the material layer to planarize the material layer.

BRIEF DESCRIPTION OF THE DRAWINGS

The above and other objects, features, and advantages of the present disclosure will become more apparent from following descriptions on embodiments thereof with reference to attached drawings, in which.

DETAILED DESCRIPTION

Figure 1:
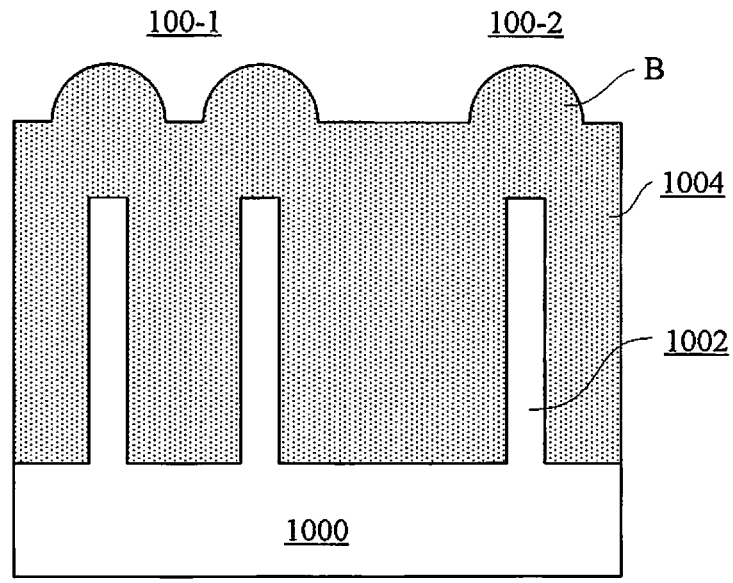
FIGS. 1-19 show an example flow of manufacturing a semiconductor device, in which a planarization process according to an embodiment of the present disclosure is incorporated.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

According to embodiments of the present disclosure, a material layer may be planarized by sputtering of, e.g., Ar or N plasma. Due to such planarization by sputtering, instead of conventional planarization by CMP, it is possible to achieve a relatively flat surface of the material layer. The material layer may comprise a variety of material layers used in semiconductor manufacture processes, for example, including but not limited to, an insulator material layer, a semiconductor material layer and a conductor material layer.

Further, there may be a loading effect in the sputtering. The so-called "loading effect" means that the material layer may have its thickness and/or morphology and the like after the sputtering affected by a pattern present in the material layer as well as a density of the pattern (or morphology of the material layer) and the like. Therefore, it is preferable to take the loading effect into account in the sputtering to obtain a relatively flat surface.

For example, if the material layer comprises a raided portion due to an underlying (raised) feature, an area where the raised portion is located may need to suffer "more" sputtering than another area where there is no raised portion, so that this area can be kept substantially flat with the other area. Here, the so-called "more" sputtering means, for example, sputtering for a longer time period under the same sputtering parameters (e.g. sputtering power and/or atmospheric pressure); or a greater sputtering intensity (e.g. greater sputtering power and/or atmospheric pressure) for the same sputtering time period; or the like. That is, the raised portion has a larger loading condition for the sputtering.

On the other hand, if the material layer comprises a recessed portion due to an underlying (recessed) feature, an area where the recessed portion is located may need to suffer "less" sputtering than another area where there is no recessed portion, so that this area may be kept substantially flat with the other area. That is, the recessed portion has a smaller loading condition for the sputtering.

Further, if there are a plurality of non-uniformly distributed features, the material layer may have non-uniformly distributed protrusions and/or recesses due to the features. This causes the loading condition vary across the substrate. For example, for the protrusions, the loading condition of an area in which a distribution density is larger is higher than that of an area in which the distribution density is smaller; and for the recesses, the loading condition of an area in which the distribution density is larger is lower than that of an area in which the distribution density is lower. Such non-uniformly distributed loading condition may prevent the sputtering from being performed uniformly.

According to an example of the present disclosure, photolithography may be incorporated into the planarization process of the material layer by sputtering, so as to implement selective planarization. For example, before sputtering, an area of the material layer where the loading condition is relatively low may be shielded by a shielding layer, and then an exposed portion of the material layer can be subjected to sputtering (hereinafter, "first sputtering"). Due to the first sputtering, the exposed portion of the material layer may have its loading condition lowered, so as to be close to or substantially equal to that of the shielded portion. After that, the first shielding layer may be removed, and the material layer as a whole (with improved uniformity in the loading condition due to the first sputtering) can be subjected to sputtering (hereinafter, "second sputtering"). As such, the second sputtering may be performed in a substantially uniform manner across the substrate, which may facilitate to obtain a relatively flat surface.

The above described features may comprise various features capable of being formed on the substrate, e.g., including but not limited to, a raised feature, such as gate and fin, on the substrate, and/or a recessed feature, such as a gate trench formed by removing a sacrificial gate in the gate last process, on the substrate.

The technology of the present disclosure can be implemented in various ways, and some examples where it is applied to Fin Field Effect Transistors (FinFETS) are exemplified in the following.

As shown in FIG. 1, a substrate 1000 may be provided. The substrate 1000 may comprise various forms of substrates, e.g., including but not limited to, a bulk semiconductor substrate such as a bulk Si substrate, a Semiconductor-on-Insulator (SOI) substrate, a SiGe substrate, or the like. In the following descriptions, the bulk Si substrate is described by way of example.

The substrate 1000 may be patterned to form fins thereon. For example, this may be done as follows. Specifically, patterned photoresist (not shown) may be formed on the substrate 1000 according to the design, and then the substrate 1000 may be etched by, e.g., Reactive Ion Etching (RIE), with the patterned photoresist as a mask, in order to form the fins 1002. Then, the photoresist may be removed. In the example as shown in FIG. 1, the fins 1002 have a relatively high distribution density in an area 100-1 while a relatively low distribution density in an area 100-2 according to design requirements.

It should be noted that the shape of trenches (between the fins) formed by etching is not necessarily a regular rectangle as shown in FIG. 1, but may be tapered from top down. Further, positions and the number of the fins formed are not limited to the example as shown in FIG. 1.

Furthermore, the fin is not limited to being formed by directly patterning the substrate. For example, the fin may be formed by epitaxially growing another semiconductor layer on the substrate and then patterning the other semiconductor layer. If there is sufficient etching selectivity between the other semiconductor layer and the substrate, the patterning of the fin may be stopped at the substrate, so as to implement a more precise control on a height of the fin.

An isolation layer may be formed on the substrate after the fins are formed by the above process.

Specifically, as shown in FIG. 1, a dielectric layer 1004 may be formed on the substrate by e.g. deposition, so as to cover the formed fins 1002. For example, the dielectric layer 1004 may comprise oxide such as silicon oxide. Due to the presence of the fins 1002, protrusions B may exist on the dielectric layer 1004. Accordingly, the protrusions B have a relatively high distribution density in the area 100-1 while a relatively low distribution density in the area 100-2. To this end, the dielectric layer 1004 needs to be planarized. According to a preferred embodiment of the present disclosure, the planarization processing may be performed by double sputtering.

Figure 2:
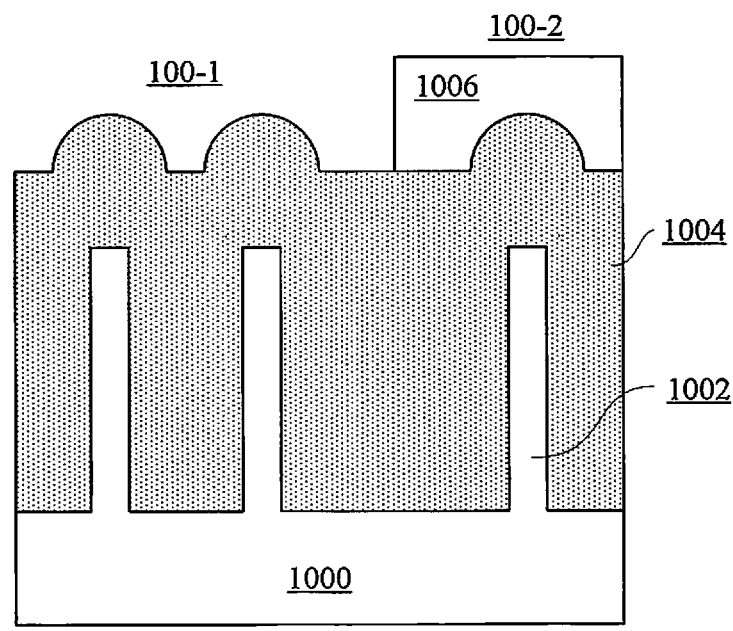

Specifically, as shown in FIG. 2, a patterned shielding layer 1006 may be formed on the dielectric layer 1004 to shield the area 100-2 where the protrusions B have the relatively low distribution density. For example, the shielding layer 1006 may comprise photoresist, which can be patterned by operations such as exposure via a mask and development. The mask for exposing the photoresist 1006 may be designed according to the mask for forming the fins 1002 (which determines the locations, the shape or the like of the fins 1002, and thus partially determines the distribution density of the fins 1002), for example.

Figure 3:
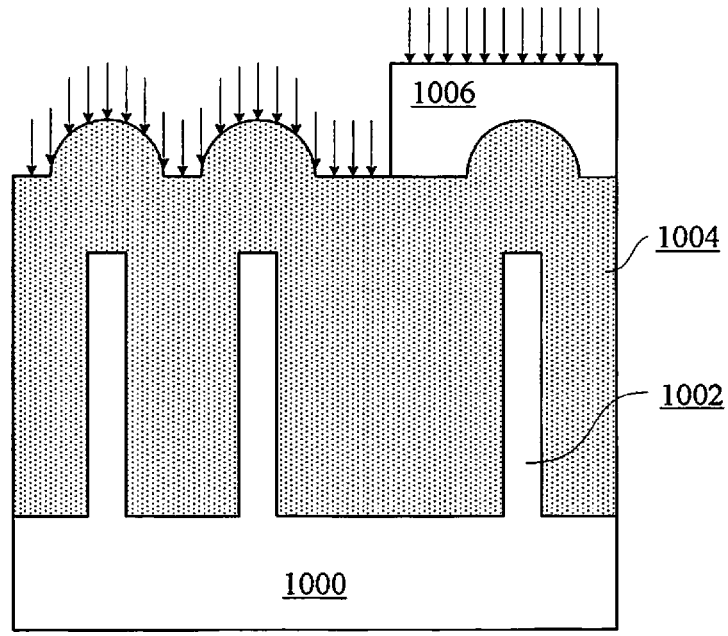

Then, as shown in FIG. 3, an exposed portion of the dielectric layer 1004 may be subjected to sputtering (or "first sputtering"). For example, plasma such as Ar or N plasma may be used for sputtering. Here, sputtering parameters, such as sputtering power and atmospheric pressure, may be controlled according to a cutting rate of the dielectric layer 1004 by the plasma sputtering, so as to determine a time period for the plasma sputtering. Thus, the plasma sputtering can be performed for a certain time period so as to lower the loading condition in the area 100-1 to be close to or substantially equal to that in the area 100-2. For example, the time period for the first sputtering may be determined based on the sputtering parameters and the difference in the feature density between the areas 100-1 and 100-2. Then, the shielding layer 1006 may be removed.

Figure 4:
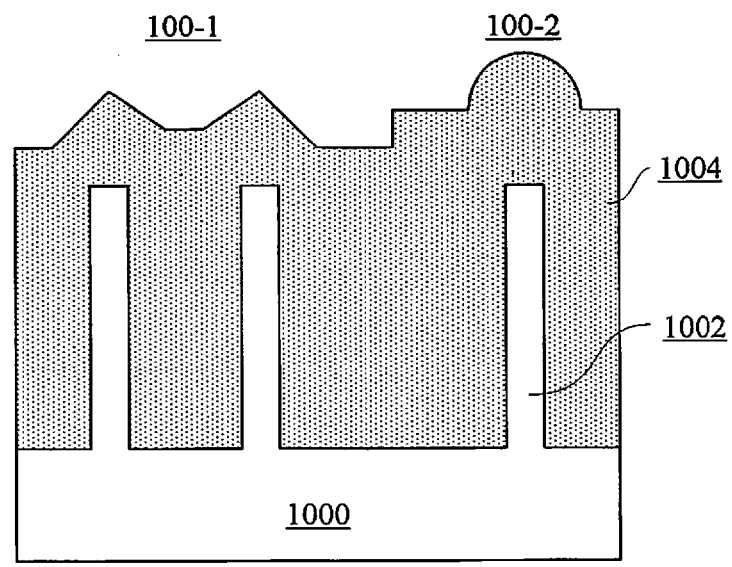

This results in the structure shown in FIG. 4. As shown in FIG. 4, the protrusions in the area 100-1 have been reduced in height, resulting in a reduced loading condition in this area, which becomes close to or substantially equal to that in the area 100-2. This facilitates subsequent second sputtering to be performed in a uniform way.

Figure 5A:
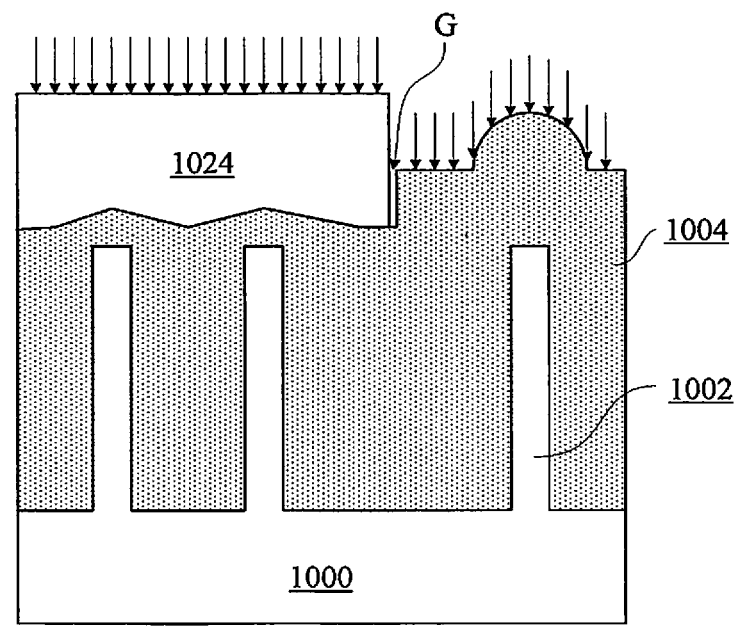
FIG. 5a shows an alternative operation to that shown in FIG. 5 according to a further embodiment of the present disclosure.
Figure 5:
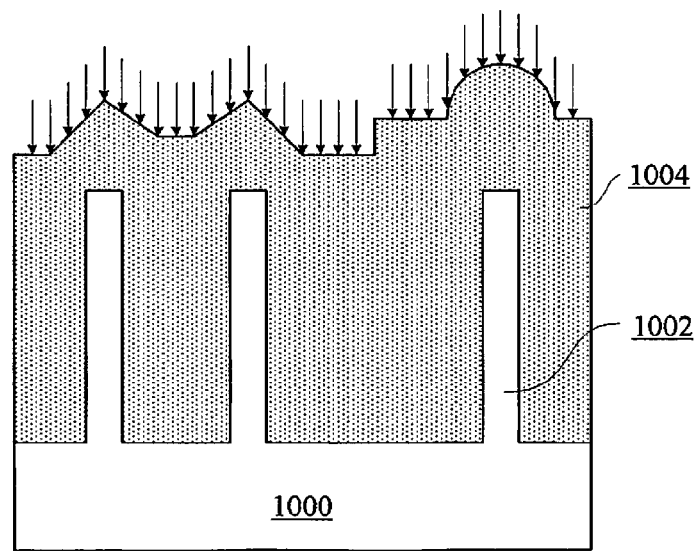

Next, as shown in FIG. 5, the dielectric layer 1004 as a whole may be subjected to sputtering (or "second sputtering") so as to be planarized. Likewise, plasma such as Ar or N plasma may be used for sputtering. Here, sputtering parameters, such as sputtering power and atmospheric pressure, may be controlled according to a cutting rate of the dielectric layer 1004 by the plasma sputtering, so as to determine a time period for the plasma sputtering. Thus, the plasma sputtering can be performed for a certain time period so as to sufficiently smooth the surface of the dielectric layer 1004. Since the uniformity of the loading condition across the substrate is improved due to the first sputtering as described above, the second sputtering can be performed in a substantially uniform way, resulting in a relatively flat surface.

Figure 6:
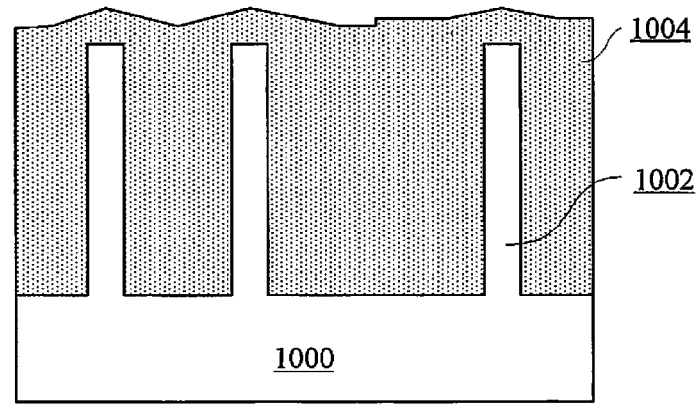

FIG. 6 shows a result after planarization by the second sputtering. Although FIG. 6 shows microscopic fluctuations, the surface of the dielectric layer 1004 actually has a sufficient flatness, with fluctuations thereof controlled within, for example, several nanometers. In the example as shown in FIG. 6, the plasma sputtering may be stopped before reaching the top surface of the fins 1002, so as to avoid damaging the fins 1002. According to another embodiment of the present disclosure, the dielectric layer 1004 may be subjected to some CMP after planarization by sputtering, if necessary.

Figure 7:
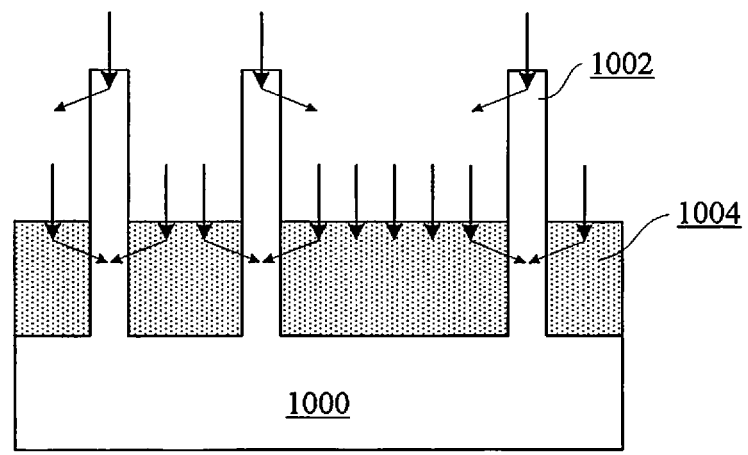

After the surface of the dielectric layer 1004 is sufficiently smoothed by the plasma sputtering, the dielectric layer 1004 may be etched back by e.g. RIE to expose a portion of the respective fins 1002, as shown in FIG. 7. The exposed portion of the fin 1002 may be subsequently used as a real fin for a final device. The isolation layer may be constituted by the remaining dielectric layer 1004. Since the surface of the dielectric layer 1004 becomes smooth by sputtering before the etching-back, the surface of the isolation layer 1004 may keep substantially consistent across the substrate after the etching-back.

Figure 8:
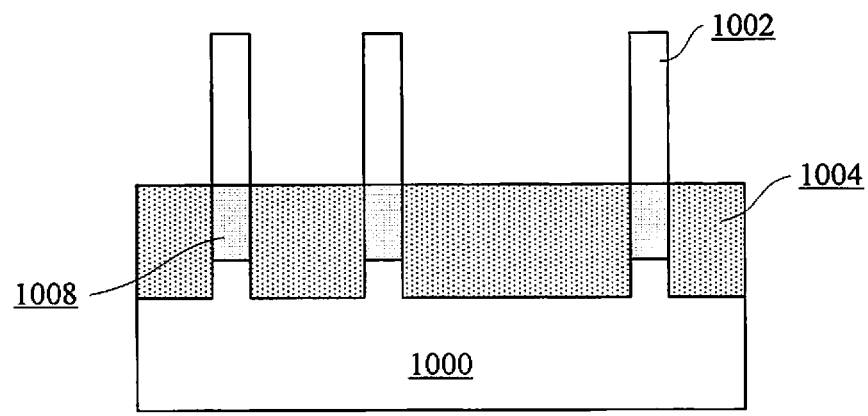

According to an example of the present disclosure, a punch-through stopper (referring to 1008 as shown in FIG. 8) may be formed by implantation in order to improve device performances, as shown by arrows in FIG. 7. For example, p-type impurities such as B, BF2 or In may be implanted for an n-type device; and n-type impurities such as As or P may be implanted for a p-type device. The ion implantation may be carried out in a direction substantially perpendicular to the surface of the substrate. Parameters for the ion implantation may be controlled, so that the punch-through stopper may be formed in a portion of the fin which is located below the surface of the isolation layer 1004 and may have a desired doping concentration. It should be noted that a part of dopants (ions or elements) may be scattered from the exposed portions of the fins due to a form factor of the fins. Thus, it is beneficial to form an abrupt doping distribution in a depth direction. Annealing may be performed to activate the implanted impurities. Such a punch-through stopper may facilitate to reduce leakage between source and drain.

Figure 9:
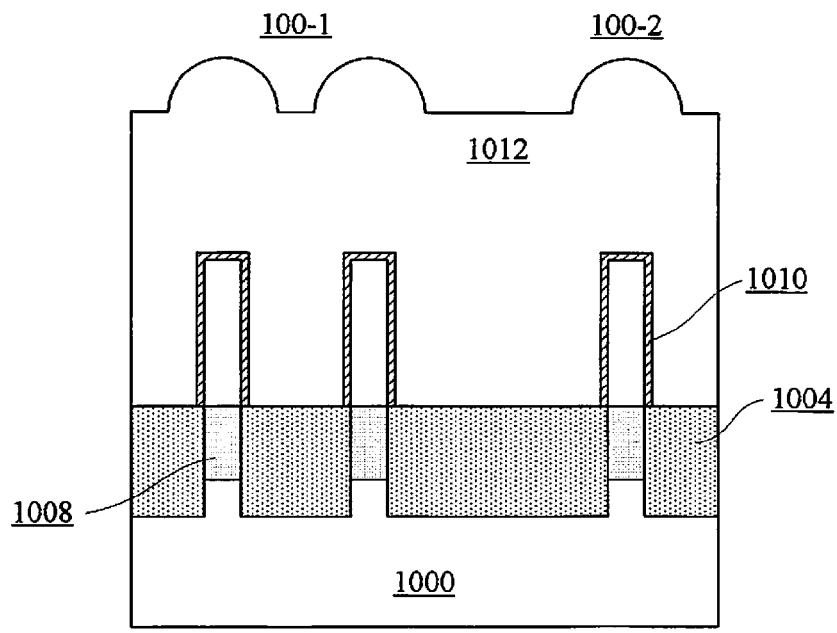

Next, a gate stack across the fin may be formed on the isolation layer 1004. For example, this may be done as follows. Specifically, as shown in FIG. 9, a gate dielectric layer 1010 may be formed by e.g. deposition. For example, the gate dielectric layer 1010 may comprise oxide with a thickness of about 0.8-1.5 nm. In the example as shown in FIG. 9, the gate dielectric layer 1010 is shown in a "Π" shape. However, the gate dielectric layer 1010 may also include a portion extending on the top surface of the isolation layer 1004. Then, a gate conductor layer 1012 may be formed by e.g. deposition. For example, the gate conductor layer 1012 may comprise polysilicon with a thickness of about 30-200 nm. The gate conductor layer 1012 may fill the gaps between the fins. There are also protrusions on the gate conductor layer 1012 due to the fins. Accordingly, the protrusions have a relatively high distribution density in the area 100-1 while a relatively low distribution density in the area 100-2.

Figure 10:
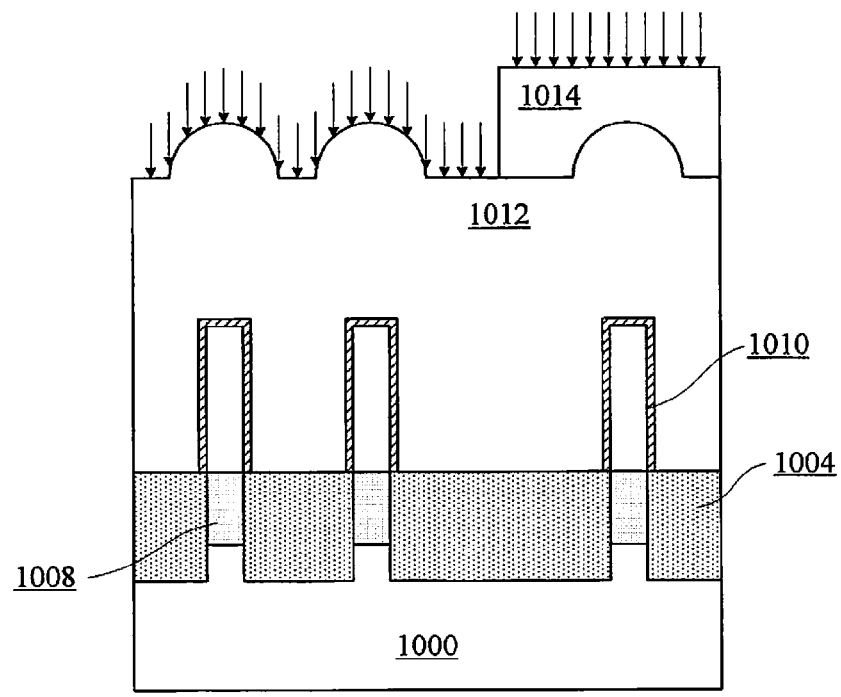

Here, the gate conductor layer 1012 may also be planarized by the technique according to the present disclosure. Specifically, as shown in FIG. 10, a patterned shielding layer 1014 may be formed on the gate conductor layer 1012, to shield the area 100-2 where the protrusions the relatively low distribution density. For example, the shielding layer 1014 may be formed similarly to the shielding layer 1016 as described above (referring to the above explanations in connection with FIG. 2). Then, an exposed portion of the gate conductor 1012 may be subjected to sputtering (hereinafter, "first sputtering"). For example, plasma such as Ar or N plasma may be used for sputtering. Here, sputtering parameters, such as sputtering power and atmospheric pressure, may be controlled according to a cutting rate of the gate conductor layer 1012 by the plasma sputtering, so as to determine a time period for the plasma sputtering. Thus, the plasma sputtering can be performed for a certain time period so as to lower the loading condition in the area 100-1 to be close to or substantially equal to that in the area 100-2. For example, the time period for the first sputtering may be determined based on the sputtering parameters and the difference in the feature density between the areas 100-1 and 100-2. Then, the shielding layer 1014 may be removed.

Figure 11:
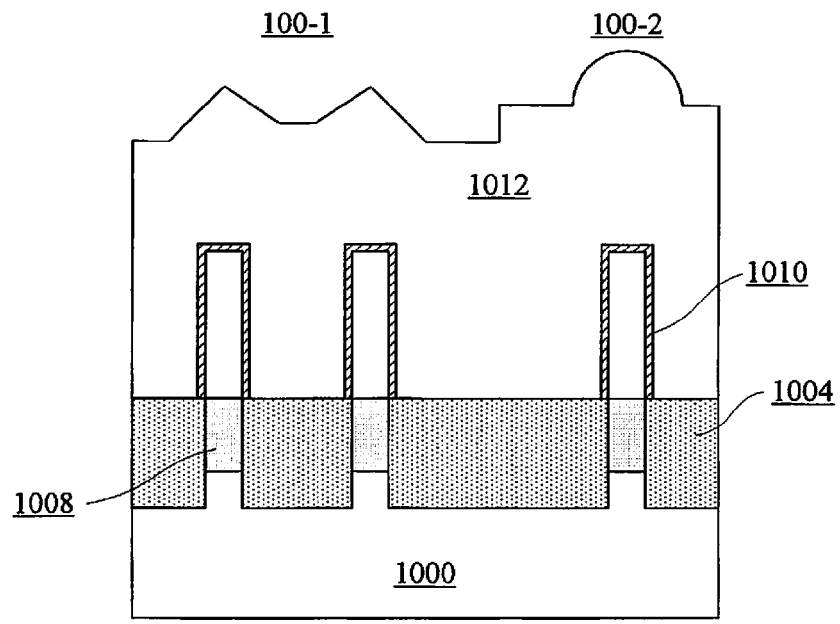

This results in the structure shown in FIG. 11. As shown in FIG. 11, the protrusions in the area 100-1 have been reduced in height, resulting in a reduced loading condition in this area, which becomes close to or substantially equal to that in the area 100-2. This facilitates subsequent second sputtering to be performed in a uniform way.

Figure 12:
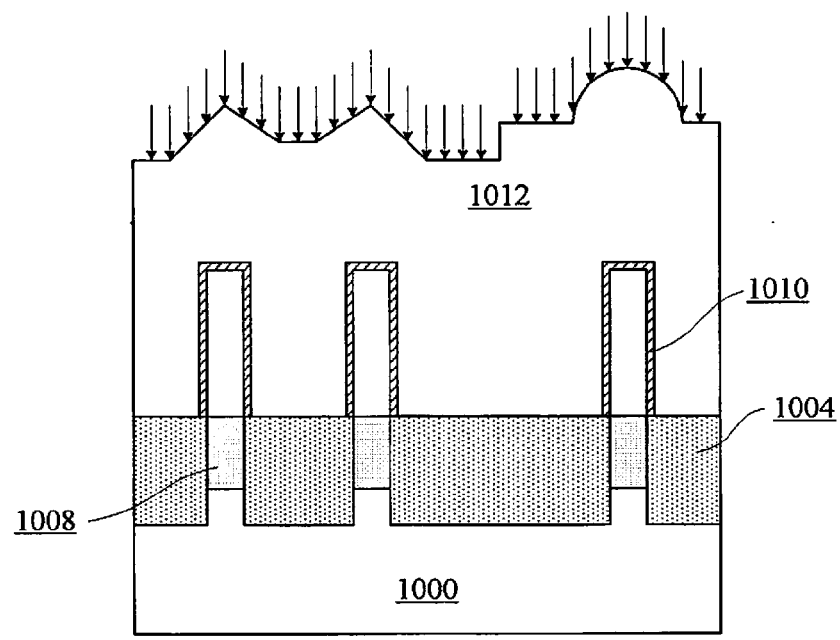

Next, as shown in FIG. 12, the gate conductor layer 1012 as a whole may be subjected to sputtering (or "second sputtering") so as to be planarized. Likewise, plasma such as Ar or N plasma may be used for sputtering. Here, sputtering parameters, such as sputtering power and atmospheric pressure, may be controlled according to a cutting rate of the gate conductor layer 1012 by the plasma sputtering, so as to determine a time period for the plasma sputtering. Thus, the plasma sputtering can be performed for a certain time period so as to sufficiently smooth the surface of the gate conductor layer 1012. Since the uniformity of the loading condition across the substrate is improved due to the first sputtering as described above, the second sputtering can be performed in a substantially uniform way, resulting in a relatively flat surface.

Figure 13:
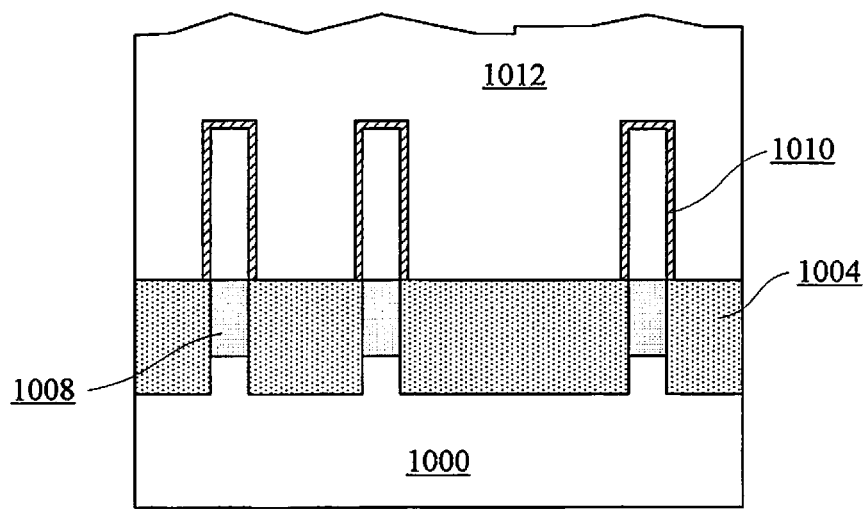

FIG. 13 shows a result after planarization by the second sputtering. Although FIG. 13 shows microscopic fluctuations, the surface of the gate conductor layer 1012 actually has a sufficient flatness, with fluctuations thereof controlled within, for example, several nanometers. According to a further embodiment, the gate conductor layer 1012 may be subjected to some CMP after the planarization by sputtering, if necessary.

Figure 14:
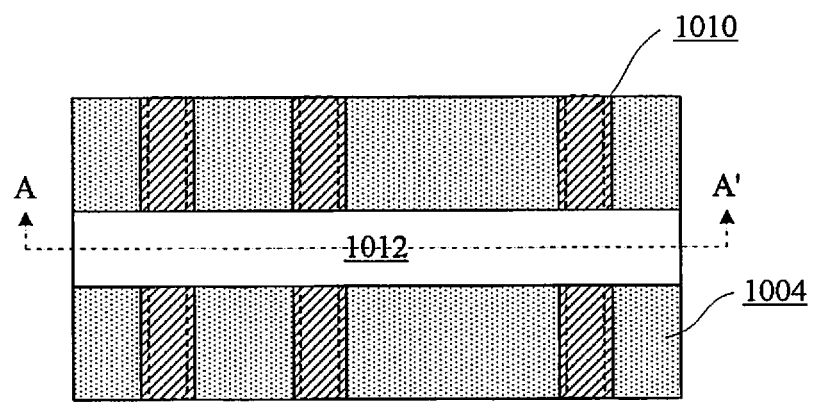

After that, as shown in FIG. 14 (FIG. 14 is a top view, and FIGS. 1-13 are cross-sectional views along line AA'), the gate conductor layer 1012 may be patterned in order to form the gate stack. In the example of FIG. 14, the gate conductor layer 1012 is patterned into be a bar intersecting the fins. According to another embodiment, the gate dielectric layer 1010 may be further patterned with the patterned gate conductor layer 1012 as a mask.

After the gate conductor is patterned, halo implantation and extension implantation may be performed with the gate conductor as a mask, for example.

Figure 15A:
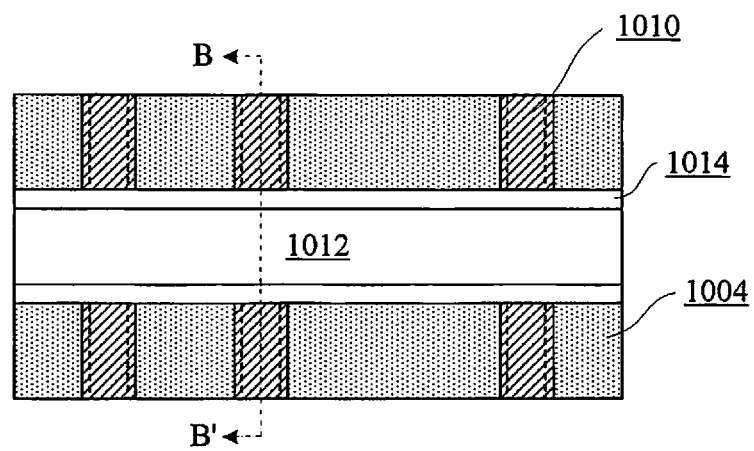
Figure 15B:
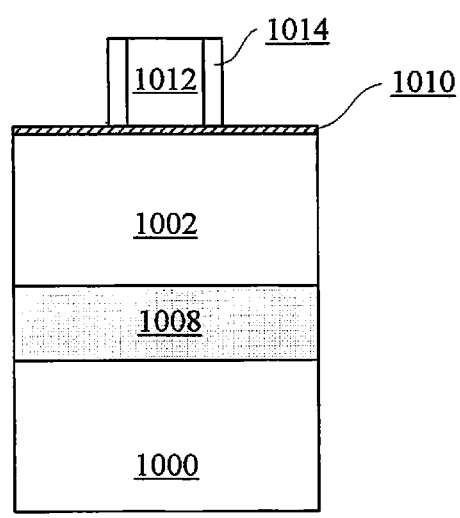

Next, as shown in FIG. 15 (FIG. 15(*b*) shows a cross-sectional view along line BB' in FIG. 15(*a*)), a spacer 1014 may be formed on side walls of the gate conductor layer 1012.

For example, nitride such as silicon nitride with a thickness of about 5-20 nm may be formed by deposition, and then subjected to RIE to form the spacer 1014. There are various methods to form the spacer, and detailed descriptions thereof are omitted here. When the trenches between the fins are tapered from top down (which is a common situation due to characteristics of etching), the spacer 1014 may have substantially no portion formed on side walls of the fins.

After the spacer is formed, source/drain (S/D) implantation may be performed with the gate conductor and the spacer as a mask. Subsequently, annealing may be performed to activate the implanted ions, so as to form source/drain regions, resulting in FinFETs.

In the embodiment as illustrated above, the gate stack is directly formed after the fins are formed. However, the present disclosure is not limited to this. For example, the present disclosure is also applicable to the gate last process. Further, the strained source/drain technique may also be incorporated.

According to another embodiment of the present disclosure, the gate dielectric layer 1010 and the gate conductor layer 1012 formed in FIG. 9 may be a sacrificial gate dielectric layer and a sacrificial gate conductor layer, respectively. Next, the process may be continued in the way as described in connection with FIGS. 9-15.

Figure 16:
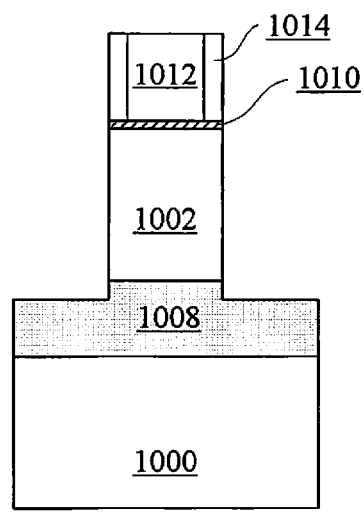

Then, as shown in FIG. 16, exposed portions of the sacrificial gate dielectric layer 1010 may be selectively removed (by e.g. RIE). In a case where both the sacrificial gate dielectric layer 1010 and the isolation layer 1004 comprise oxide, the RIE of the sacrificial gate dielectric layer 1010 may have substantially no impact on the isolation layer 1004 because the sacrificial gate dielectric layer 1010 is relatively thin. This operation is not required any more if the sacrificial gate dielectric layer has been further patterned with the sacrificial gate conductor as a mask in the process of forming the sacrificial gate stack as described above.

Next, portions of the fin 1002 which are exposed due to the removal of the sacrificial dielectric layer 1010 may be selectively removed (by e.g. RIE). The etching of those portions of the fin 1002 may be carried out until the punch-through stopper 1008 is exposed. Due to the presence of the sacrificial gate stack (the sacrificial gate dielectric layer, the sacrificial gate conductor and the spacer), a portion of the fin 1002 may be left under the sacrificial gate stack.

Figure 17:
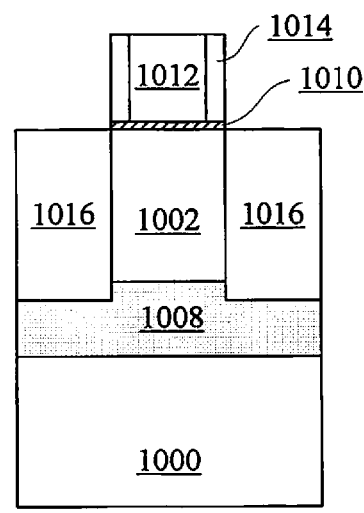

Subsequently, as shown in FIG. 17, a semiconductor layer 1016 may be formed on exposed portions of the fin by e.g. epitaxy. Then, source/drain regions may be formed in the semiconductor layer 1016. According to an embodiment of the present disclosure, the semiconductor layer 1016 may be doped in-situ while being grown. For example, n-type in-situ doping may be performed for an n-type device; while p-type in-situ doping may be performed for a p-type device. Moreover, in order to further improve the performances, the semiconductor layer 1016 may comprise a material different from that of the fin 1002 to apply strain to the fin 1002 (in which a channel of the device will be formed). For example, in a case where the fin 1002 comprises Si, the semiconductor layer 1016 may comprise Si:C (where an atomic percentage of C is e.g. about 0.2-2%) to apply tensile stress for the n-type device, or SiGe (where an atomic percentage of Ge is e.g. about 15-75%) to apply compressive stress for the p-type device.

In a case where the sacrificial gate conductor layer 1012 comprises polysilicon, the growth of the semiconductor layer 1016 may occur on the top surface of the sacrificial gate conductor 1012. This is not shown in the drawings.

Figure 18:
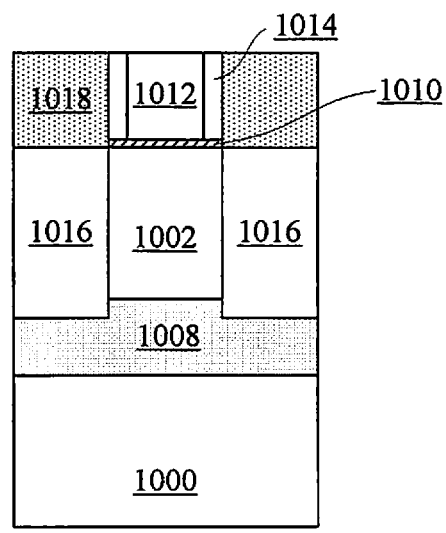

Next, as shown in FIG. 18, a further dielectric layer 1018 may be formed by e.g. deposition. The dielectric layer 1018 may comprise e.g. oxide. Subsequently, the dielectric layer 1018 may be planarized by e.g. CMP. The CMP may be stopped at the spacer 1014, so as to expose the sacrificial gate conductor 1012.

Figure 19:
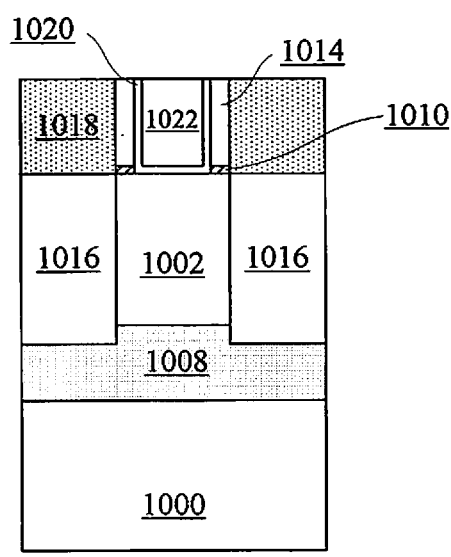

Then, as shown in FIG. 19, the sacrificial gate conductor 1012 may be selectively removed by e.g. TMAH solution, so as to form a gap inside the spacer 1014. According to another example, the sacrificial gate dielectric layer 1010 may be further removed. Next, a gate dielectric layer 1020 and a gate conductor layer 1022 may be formed in the gap, so as to form a final gate stack. The gate dielectric layer 1020 may comprise a high-K gate dielectric, e.g. $HfO_2$, with a thickness of about 1-5 nm. The gate conductor layer 1022 may comprise a metal gate conductor. Preferably, a work function adjustment layer (not shown) may also be formed between the gate dielectric layer 1020 and the gate conductor layer 1022.

In the above embodiments, the first sputtering is intended to reduce the loading condition for sputtering in the area where the protrusions have the relatively high density (or, the area where the loading condition is relatively high), instead of achieving a flat surface. According to a further embodiment, the first sputtering can also be used for surface planarization.

Figure 4A:
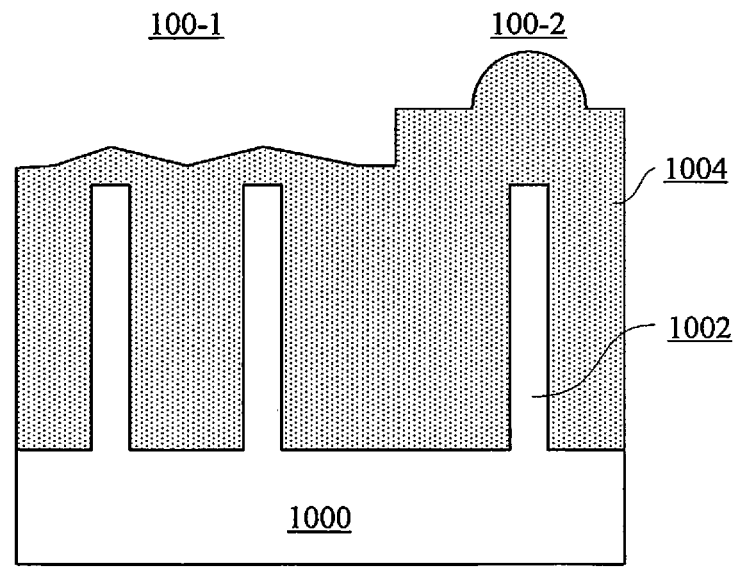
FIG. 4a shows an alternative operation to that shown in FIG. 4 according to a further embodiment of the present disclosure.

For example, in the first sputtering operation as described above in conjunction with FIG. 3, not only the loading condition in the area 100-1 is reduced, but also the plasma sputtering is carried out for a certain time period to sufficiently smooth the surface of the dielectric layer 1004 (in the area 100-1). FIG. 4a shows a result after the planarization by the first sputtering. Although FIG. 4a shows microscopic fluctuations, the surface of the dielectric layer 1004 (in the area 100-1) actually has a sufficient flatness, with fluctuations thereof controlled within, for example, several nanometers. In the example as shown in FIG. 4a, the plasma sputtering may be stopped before reaching the top surface of the fins 1002, so as to avoid damaging the fins 1002.

Then, instead of the operation shown in FIG. 5, a further patterned shielding layer 1024 may be formed on the dielectric layer 1004, as shown in FIG. 5a, to shield the area 100-1 where the protrusions have the relatively high density (which area has been planarized as shown in FIG. 4a). For example, the shielding layer 1024 may comprise photoresist, which can be patterned by operations such as exposure via a mask and development. The mask for exposing the shielding layer 1024 may be designed according to the mask for forming the fins 1002 (which determines the locations, the shape or the like of the fins 1002, and thus partially determines the distribution density of the fins 1002), for example. Preferably, the shielding layer 1024 does not overlap with the previous shielding layer 1006 in position, but with a gap G therebetween.

Then, an exposed portion of the dielectric layer 1004 may be subjected to sputtering (or "second sputtering"). For example, plasma such as Ar or N plasma may be used for sputtering. Here, sputtering parameters, such as sputtering power and atmospheric pressure, may be controlled according to a cutting rate of the dielectric layer 1004 by the plasma sputtering, so as to determine a time period for the plasma sputtering. Thus, the plasma sputtering can be performed for a certain time period so as to sufficiently smooth the surface of the dielectric layer 1004 (in the area 100-2). Here, the surface of the dielectric layer 1004 may be made substantially flat in the areas 100-1 and 100-2 after the first and second sputtering, for example with a difference in height less than about 3-5 nm, based on the loading conditions for sputtering in the areas 100-1 and 100-2 and also the process parameters used in the first and second sputtering. Then, the shielding layer 1024 may be removed.

The first and second sputters as described above also results in the structure as shown in FIG. 6. Further, in this embodiment, the order of the first and second sputtering can be changed.

Figure 11A:
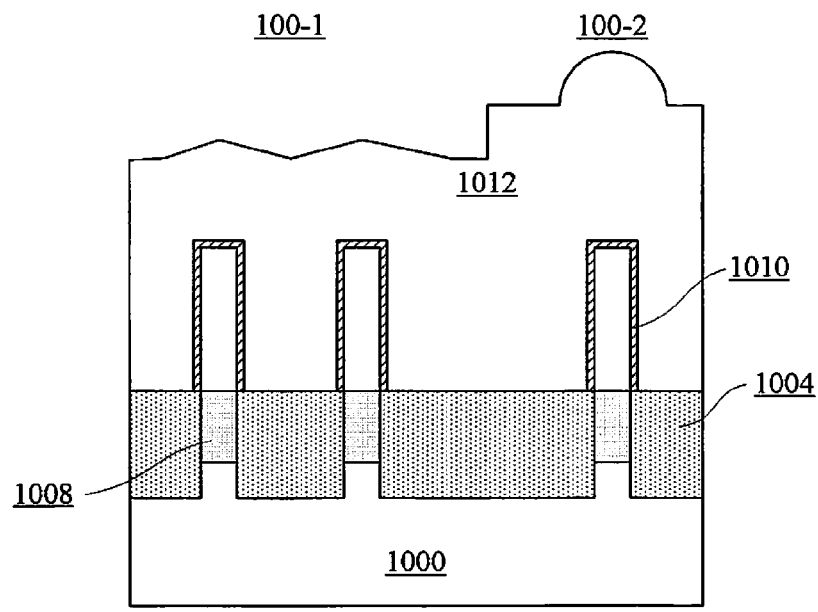
FIG. 11a shows an alternative operation to that shown in FIG. 11 according to a further embodiment of the present disclosure.

Likewise, in the first sputtering operation as described above in conjunction with FIG. 10, not only the loading condition in the area 100-1 is reduced, but also the plasma sputtering is carried out for a certain time period to sufficiently smooth the surface of the gate conductor layer 1012 (in the area 100-1). FIG. 11a shows a result after the planarization by the first sputtering. Although FIG. 11a shows microscopic fluctuations, the surface of the gate conductor layer 1012 (in the area 100-1) actually has a sufficient flatness, with fluctuations thereof controlled within, for example, several nanometers.

Figure 12A:
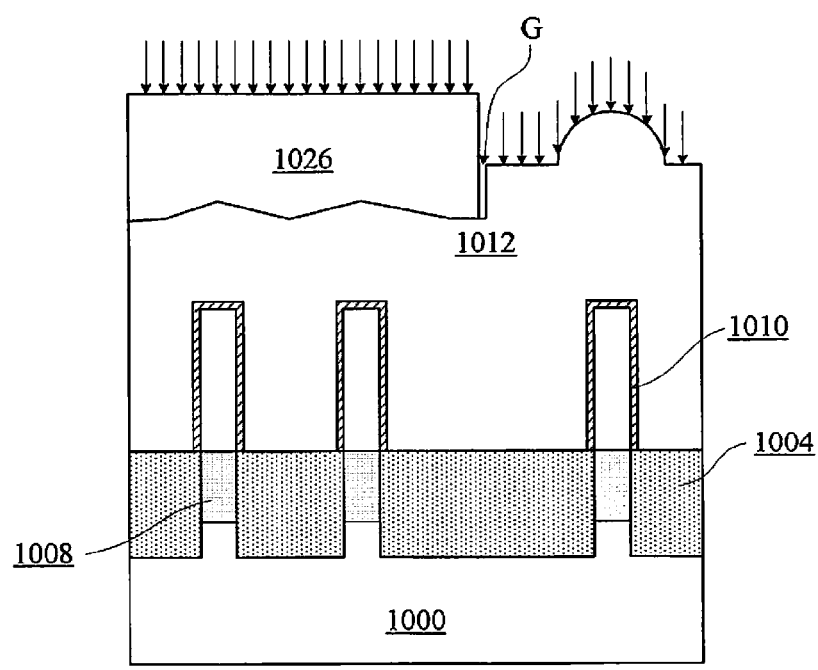
FIG. 12a shows an alternative operation to that shown in FIG. 12 according to a further embodiment of the present disclosure.

Then, instead of the operation shown in FIG. 12, a further patterned shielding layer 1026 may be formed on the gate conductor layer 1012, as shown in FIG. 12a, to shield the area 100-1 where the protrusions have the relatively high density (which area has been planarized as shown in FIG. 11a). For example, the shielding layer 1026 may comprise photoresist, which can be patterned by operations such as exposure via a mask and development. The mask for exposing the shielding layer 1026 may be designed according to the mask for forming the fins 1002 (which determines the locations, the shape or the like of the fins 1002, and thus partially determines the distribution density of the fins 1002), for example. Preferably, the shielding layer 1026 does not overlap with the previous shielding layer 1014 in position, but with a gap G therebetween.

Then, an exposed portion of the gate conductor layer 1012 may be subjected to sputtering (or "second sputtering"). For example, plasma such as Ar or N plasma may be used for sputtering. Here, sputtering parameters, such as sputtering power and atmospheric pressure, may be controlled according to a cutting rate of the gate conductor layer 1012 by the plasma sputtering, so as to determine a time period for the plasma sputtering. Thus, the plasma sputtering can be performed for a certain time period so as to sufficiently smooth the surface of the gate conductor layer 1012 (in the area 100-2). Here, the surface of the gate conductor layer 1012 may be made substantially flat in the areas 100-1 and 100-2 after the first and second sputtering, for example with a difference in height less than about 3-5 nm, based on the loading conditions in the areas 100-1 and 100-2 and also the process parameters used in the first and second sputtering. Then, the shielding layer 1026 may be removed.

The first and second sputters as described above also results in the structure as shown in FIG. 13. Further, in this embodiment, the order of the first and second sputtering can be changed.

In the above embodiments, the concept of the present disclosure is used for manufacture of FinFETs. However, the present disclosure is not limited thereto. The technology disclosed herein is also applicable to various applications where planarization is needed.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method of planarizing a material layer formed on a substrate, comprising:
    performing first planarizing with sputtering on the material layer with an area of the material layer, which has a relatively low loading condition for sputtering, shielded by a first shielding layer;
    removing the first shielding layer; and
    performing second planarizing with sputtering on the material layer to planarize the material layer.

2. The method of claim 1, wherein the substrate comprises a plurality of features distributed non-uniformly thereon and the material layer is formed on the substrate to cover the features, and wherein the area which has the relatively low loading condition for sputtering corresponds to an area where the features have a relatively low distribution density.

3. The method of claim 2, wherein the feature comprises a fin, and the material layer comprises dielectric.

4. The method of claim 3, wherein after the second planarizing with sputtering, the method further comprises:
    further etching back the material layer to expose the fin.

5. The method of claim 4, wherein after the further etching-back, the method further comprises:
    performing ion implantation to form a punch-through stopper in a portion of the fin which is located below a surface of the further etched-back material layer.

6. The method of claim 5, wherein after the ion implantation, the method further comprises:
    forming a sacrificial gate stack across the fin on the material layer;
    selectively etching the fin with the sacrificial gate stack as a mask, until the punch-through stopper layer is exposed;
    forming a semiconductor layer on exposed portions of the fin to form source/drain regions; and
    replacing the sacrificial gate stack with a gate stack.

7. The method according to claim 6,
    wherein forming the sacrificial gate stack comprises:
    forming a sacrificial gate dielectric layer on the material layer;
    forming a sacrificial gate conductor layer on the sacrificial gate dielectric layer;
    planarizing and patterning the sacrificial gate conductor layer; and
    forming a spacer on a side wall of the patterned sacrificial gate conductor, and
    wherein planarizing the sacrificial gate conductor layer comprises:
    forming a further first shielding layer in the area which has the relatively low loading condition for sputtering, and performing further first planarizing with sputtering on an exposed portion of the sacrificial gate conductor layer;
    removing the further first shielding layer; and
    performing further second planarizing with sputtering on the sacrificial gate conductor layer to planarize the sacrificial gate conductor layer.

8. The method of claim 7, wherein the further first planarizing with sputtering is performed to planarize the exposed portion of the sacrificial gate conductor layer, and wherein after removing the further first shielding layer and before performing the further second sputtering, the method further comprises:

forming a further second shielding layer on the exposed portion of the sacrificial gate conductor layer, wherein the further second shielding layer does not overlap with the further first shielding layer.

9. The method of claim 2, wherein the feature comprises a fin, and the material layer comprises a gate conductor layer which covers the fin via a gate dielectric layer.

10. The method of claim 1, wherein the first planarizing with sputtering is performed to planarize a portion of the material layer which is not covered by the first shielding layer, and wherein after removing the first shielding layer and before performing the second planarizing with sputtering, the method further comprises:

forming a second shielding layer on the portion of the material layer, wherein the second shielding layer does not overlap with the first shielding layer.

11. The method of claim 1, wherein the sputtering is performed by using Ar or N plasma.

12. A method of planarizing a material layer formed on a substrate, comprising:

performing first planarizing with sputtering on the material layer, with an area of the material layer which has a relatively high loading condition for sputtering shielded by a first shielding layer, to planarize a portion of the material layer which is not shielded by the first shielding layer;

removing the first shielding layer;

forming a second shielding layer on the portion of the material layer, wherein the second shielding layer does not overlap with the first shielding layer; and performing second sputtering on the material layer to planarize the material layer.

* * * * *